United States Patent
Burton et al.

(10) Patent No.: US 6,573,599 B1
(45) Date of Patent: Jun. 3, 2003

(54) ELECTRICAL CONTACT FOR COMPOUND SEMICONDUCTOR DEVICE AND METHOD FOR FORMING SAME

(75) Inventors: Richard S. Burton, Newbury Park, CA (US); Philip C. Canfield, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/580,323

(22) Filed: May 26, 2000

(51) Int. Cl.[7] .............................................. H01L 21/28

(52) U.S. Cl. ...................... 257/745; 257/753; 257/767; 257/769

(58) Field of Search ................. 438/606, 622, 438/638, 648–651, 656, 665, 672; 257/767–70, 750–51, 757, 745–761, 763–4, 775

(56) References Cited

U.S. PATENT DOCUMENTS

| | | | |
|---|---|---|---|
| 4,593,457 A | | 6/1986 | Birrittella |
| 5,037,769 A | | 8/1991 | Inada |
| 5,389,562 A | | 2/1995 | Mohammad |
| 5,436,181 A | | 7/1995 | Morris |
| 6,320,265 B1 | * | 11/2001 | Chakrabarti et al. ........ 257/750 |

OTHER PUBLICATIONS

C. Dubon–Chevallier, et al., Comprehensive Study of AuMn p–type ohmic conduct for GaAs/GaAlAs heterojunction bipolar transistors, Feb. 12, 1986, 4 pages.

H. Sheng, et al., Effect of Alloying and Bias Stress on the Basic Contacts of AlGaAs/GaAs HBTs, 6 pages.

J. C. Zolper, et al., An All–Implanted, Self–Aligned, GaAs JFET With a Nonalloyed W/p+–GaAs Ohmic Gate Contact, 1994, 5 pages.

Lian Peng, et al., No–alloy Ohmic Contact to Heavily Carbon–doped GaAs, 1998, 4 pages.

M. Yanagihara, et al., Ni/Ti/Pt ohmic Contact to p–GaAs for the Heterojunction Bipolar Transistor Process, 1996, 2 pages.

G. E. Bulman, et al., Low Resistance Ti/Pt/Au Ohmic Contacts to GaAs/AlxGa1–xAs Heterostructures Using Open–Tube Zn Diffusion, 1989, 4 pages.

W. O. Barnard, et al., Comparison Between Ruthenium–Based and other ohmic Contact systems to p–type GaAs, 1992, 3 pages.

P.E. Hallali, et al., Thermally Stable Ohmic Contacts to p–type GaAs. IX. NiInW and NiIn(Mn)W Contact Metals, 1991, 6 pages.

Sandip Tiwari, et al., Heterostructure Devices Using Self-Aligned p–Type Diffused Ohmic Contacts, 1988, 3 pages.

C. Maneux, et al., Analysis of GaAs HBT Failure Mechanisms, Impact on Life Test Strategy, 1977, 5 pages.

(List continued on next page.)

*Primary Examiner*—George Fourson
*Assistant Examiner*—Thanh Pham
(74) *Attorney, Agent, or Firm*—Thomas, Kayden, Horstemeyer & Risley, LLP

(57) ABSTRACT

A method of manufacturing a semiconductor device having an improved ohmic contact system. The improved ohmic contact system comprises a thin reactive layer of platinum deposited on a portion of the base layer. The improved ohmic contact system further comprises a thick refractory layer of titanium or other suitable material deposited on the thin reactive layer. Both the reactive layer and the refractory layer are substantially free of gold. The improved ohmic contact system and method for forming the same eliminate base contact punchthrough on high performance semiconductor devices, such as heterojunction bipolar transistors, minimize raw material costs, and decrease manufacturing costs.

10 Claims, 7 Drawing Sheets

OTHER PUBLICATIONS

Avishay Katz, et al., Rapid Isothermal Processing of Pt/Ti Contacts to p–Type III–V Binary and Related Ternary Materials, 1992, 9 pages.

Chushirou Kusano, et al., AlGaAs/GaAs HBT's for 10–Gb/s IC's Using a New Base Ohmic Contact Fabrication Process, 1993, 7 pages.

Sandip Tiwarti, et al., Heterostructure Devices Using Self-Aligned p–Type Diffused Ohmic Contacts, 1988, 6 pages.

D. E. Kren, et al., Low Ohmic Contact to C–Doped p–GaAs With Au/Zn/Au Structure, 1992, 3 pages.

* cited by examiner

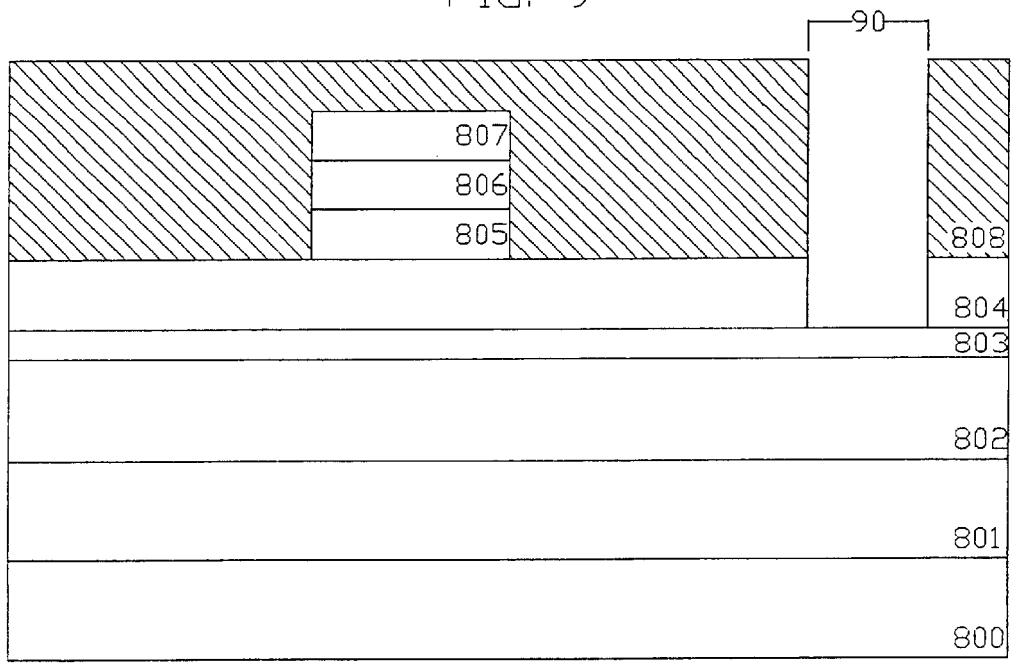
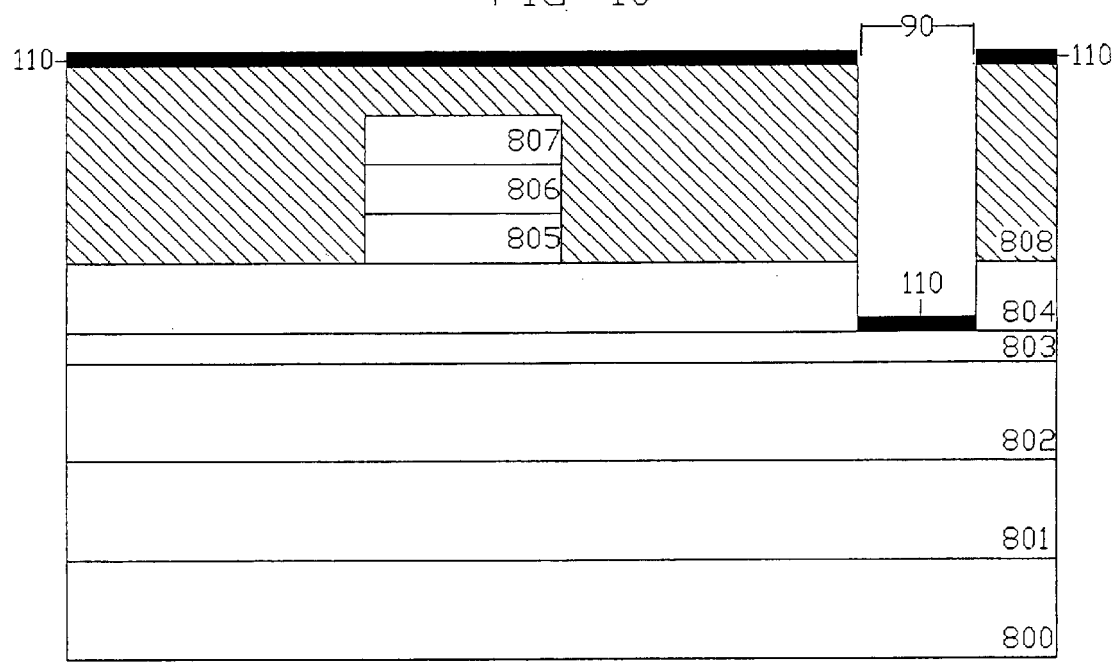

ELECTRICAL CONTACT FOR COMPOUND SEMICONDUCTOR DEVICE AND METHOD FOR FORMING SAME

FIELD OF INVENTION

This invention relates generally to semiconductor devices. More particularly, the present invention relates to an improved electrical contact system for compound semiconductor devices, such as gallium arsenide (GaAs) devices, and a method of forming the same.

BACKGROUND OF THE INVENTION

Semiconductor integrated circuits include a plurality of microelectronic structures (e.g., transistors, diodes, and the like) formed by creating a variety of doped regions in a semiconductor wafer substrate. These regions are formed by performing a number of operations, for example, epitaxial growth, diffusion, ion implantation, etching, and the like. These devices are then interconnected by a conductive metallization layer to form a desired integrated circuit.

This invention concerns semiconductor devices that are manufactured by using a multilayer structure formed through the epitaxy of semiconductor materials of different properties and that are useful as ultrahigh frequency and ultrahigh-speed transistors. For example, applications of the present invention may be found in connection with P+ contacts to laser diodes, heterojunction bipolar transistors (HBTs), light emitting diodes (LEDs), Schottky diodes, field effect transistors (FETs), metal-semiconductor field effect transistors (MESFETs), metal-oxide-semiconductor field effect transistors (MOSFETs), high electron mobility transistors (HEMTs), and other compound semiconductor and optoelectronic devices. For purposes of illustration only, and without limitation, the present invention will be described with particular reference to its application to the manufacture of gallium arsenide (GaAs)-based HBTs.

In recent years, high performance HBTs have been attracting much attention for power amplifier and high-speed digital applications, including such areas as automotive radar, traffic control, and wireless applications. The general structure of and conventional fabrication processes for HBTs are well known by those skilled in the art.

HBTs are made up of collector, base, and emitter layers disposed to form a pair of junctions. In general, an HBT is a three-terminal device in which the upper layers (i.e., the base and emitter layers) are etched away in order to expose the underlying collector layer. Contacts are made to each of the layers to provide the three-terminal device having a collector, emitter, and a base contact.

Prior art techniques typically include depositing a gold overlayer on the base contact to reduce the sheet resistance of the contact. However, although gold exhibits desirable electrical properties such as low resistivity and high conductivity, it has a tendency of inward diffusion even under moderate temperatures, which can negatively affect the performance characteristics of the electronic device. Use of diffusion barrier layers comprising refractory metals, such as tungsten, under the gold layer has been attempted in the prior art; however, such diffusion barriers are inadequate to prevent lateral "spillover" of gold and other reactive overlayer metals past the barrier layer during deposition, which results in undesirable and uncontrollable alloying and inward diffusion of these metals at the edge of the base contact.

The reliability of HBTs is directly related to the integrity of the ohmic contacts at the emitter, base, and collector layers. In particular, fabrication of base contacts with excellent ohmic characteristics, namely, low sheet resistance, is critical to achieving high-performance HBT integrated circuits. High performance HBTs are characterized by a heavily doped base and an ultra-thin base layer, generally having a thickness of less than about 500 angstroms. Because of this thin base layer, it is difficult to fabricate a direct contact between the base electrode and base layer that simultaneously reduces sheet resistance and does not alloy through the base layer due to lateral spillover.

Primary considerations in the choice of an ohmic metallization system are low specific contact resistance, thermal stability, good morphology, good adhesion to and very shallow penetration of the contact layer into the semiconductor, and resistance to wet chemical processing. The selected metallization system for the ohmic contacts must provide the correct electrical link between the active region of the semiconductor device and the external circuit, while at the same time enabling a low-energy carrier transport through the thin interface region and ensuring a negligible series resistance in it under normal device operating conditions. As is common in the art, the deposited ohmic contacts often are alloyed under relatively high-temperature conditions in order to drive the required metal-semiconductor interfacial reaction, or may experience high-temperature thermal cycles as may be required by subsequent processing steps in forming the integrated circuit. High-temperature alloy processes and/or thermal cycles may result in the formation of undesirable alloy "spikes" in the interfacial region of the ohmic contact and the underlying semiconductor layer. These spikes in the interfacial layers can lead to non-uniform current flow through the device and degraded microstructure.

Transmission Electron Micrographs (TEM) of HBTs manufactured by prior art techniques indicate formation of such submicroscopic spikes at the edge of the base contact, which are believed to be a consequence of "spillover" of excess gold and platinum at the contact edge that uncontrollably alloy with the underlying GaAs base layer during high-temperature alloy processing. These submicroscopic spikes may cause "punchthrough" of the base contact through the base layer and into the underlying collector layer. This punchthrough generally results in lower reliability and degraded performance of the semiconductor device.

Further disadvantages of prior art fabrication techniques for ultra-thin base layer HBTs include utilization of precious metals, such as gold and platinum, which increase raw material costs and which ultimately may degrade device performance characteristics, as discussed above. Additionally, as the number of metallization layers deposited to form the base contact structure increases, the cost of manufacturing the HBT device increases.

A method of forming contacts on thin base layer HBTs is thus needed that eliminates base contact punchthrough of reactive contact metallization, reduces raw material costs by eliminating and/or minimizing the use of precious metals, such as gold and platinum, and facilitates manufacturing by reducing the number of metallization layers in the contact structure, without sacrificing device performance and functionality. In particular, there exists a need in the art for a suitable ohmic contact for thin base layer HBTs that exhibits low sheet resistance, but that excludes reactive metal overlayers that have proven detrimental to the reliability and manufacturability of HBT devices of the prior art.

SUMMARY OF THE INVENTION

The present invention relates to an improved contact system for compound semiconductor devices, such as gallium arsenide (GaAs) devices, and a method of forming the same. In particular, one embodiment of the present invention relates to an improved contact system and method useful in the manufacture of P+ doped gallium arsenide (GaAs) heterojunction bipolar transistors (HBTs).

The present invention meets the aforesaid needs and solves the problem of base contact "punchthrough" by eliminating excess sources of reactive metal—such as platinum and gold—that may cause "spillover" at the contact edge. In accordance with a preferred embodiment of the present invention, a thin "reactive" layer of platinum or other suitable metal that alloys and makes good ohmic contact with the underlying P+ doped GaAs base layer is deposited on the base layer of a HBT. On this reactive layer, a cap layer of refractory metal or metallic compound is deposited, which serves as a current spreading layer. No additional overlayers of platinum or gold are necessary.

In accordance with a preferred embodiment of the present invention, the thickness of the reactive layer of the base contact is minimized such that the amount of material deposited to form the reactive layer is sufficient to create low contact resistance at the interface of the reactive layer and the base layer and is substantially completely consumed during post-deposition high-temperature alloy reactions.

In accordance with a further aspect of the present invention, increased thickness of the refractory layer metallization improves base contact sheet resistance, which enables the device to meet the performance specifications of the prior art while resolving prior art quality and manufacturing deficiencies.

These and other aspects, features and advantages of the present invention will be better understood by studying the detailed description in conjunction with the drawings and the accompanying claims.

BRIEF DESCRIPTION OF THE DRAWINGS

A detailed description of embodiments of the invention will be made with reference to the accompanying drawings, wherein like numerals designate corresponding parts in the several Figures, and wherein:

FIGS. 8 through 12 illustrate, in cross-sectional view, a process of forming an ohmic contact on the base layer of an HBT in accordance with one embodiment of the present invention.

DETAILED DESCRIPTION OF THE DRAWINGS

As those skilled in the art are aware, a variety of techniques currently exist for the fabrication of HBTs into which the method of forming a base contact provided by the present invention may be incorporated. For purposes of illustration only, and without limitation, the present invention will be described with particular reference to the below-described conventional HBT fabrication method.

A conventional method for manufacturing a heterojunction bipolar transistor device 10 is illustrated in FIGS. 1–6.

Figure 1:
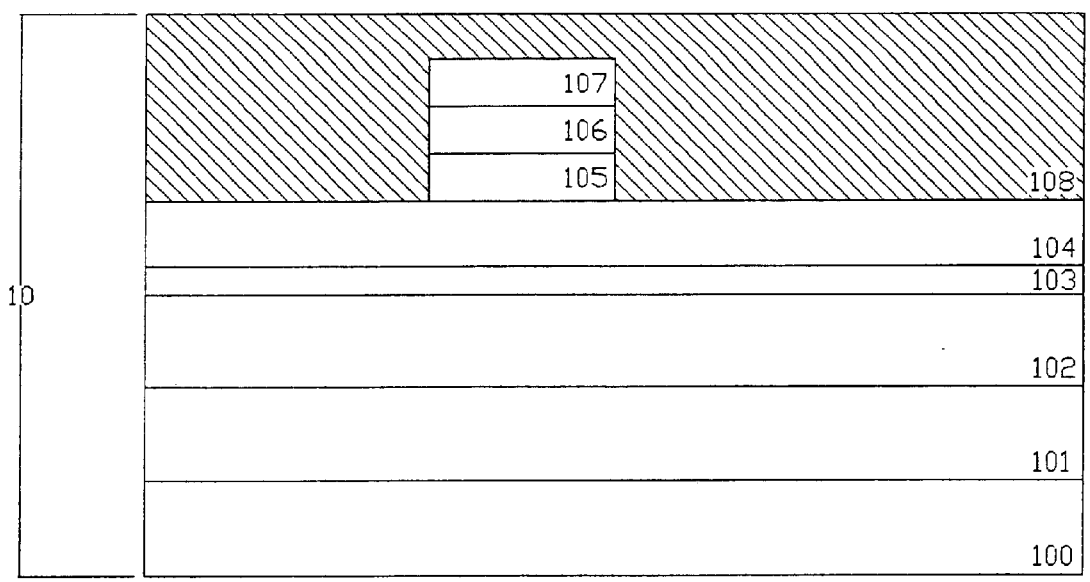
FIGS. 1 through 6 illustrate, in cross-sectional view, a prior art process of forming an ohmic contact on the base layer of an HBT.
Figure 2:
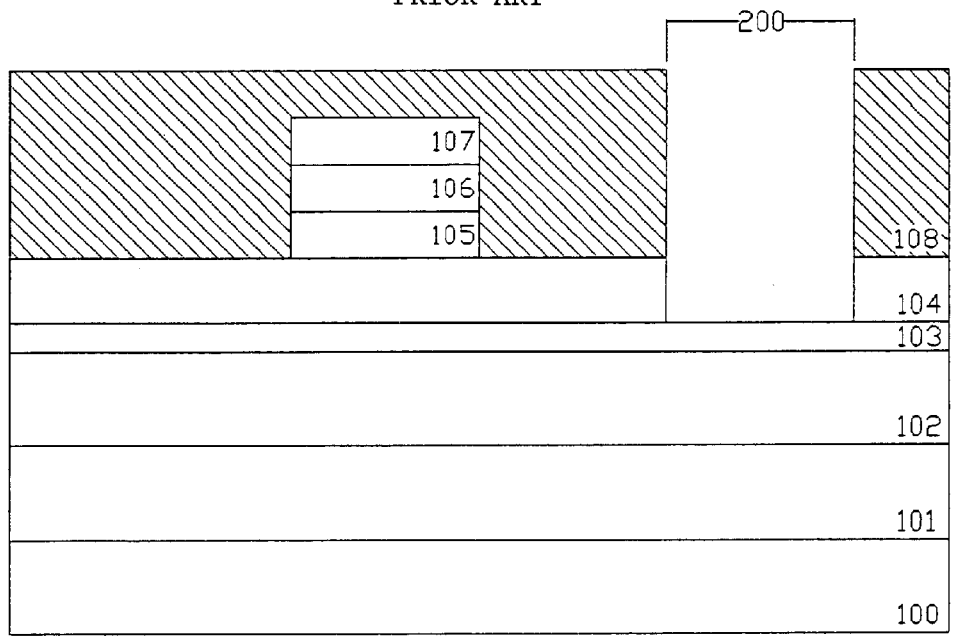

In FIG. 1, an N+ InGaAs cap layer 106, an N+ GaAs cap contact layer 105, an N type InGaP or AlGaAs emitter layer 104, a P+ GaAs base layer 103, an N− GaAs collector layer 102, and an N+ GaAs subcollector layer 101 are formed on a semi-insulating GaAs substrate 100. In addition, an emitter contact 107 is deposited on cap layer 106 using techniques well-known to those skilled in the art. A photoresist masking material 108 is deposited on emitter layer 104 and patterned using, standard photolithographic techniques. Emitter layer 104 is then etched by plasma or reactive ion etching techniques known in the art using photoresist 108 as a mask to provide an etched region 200 as shown in FIG. 2. Etched region 200 extends through emitter layer 104 to the exposed surface of base layer 103.

Figure 3:
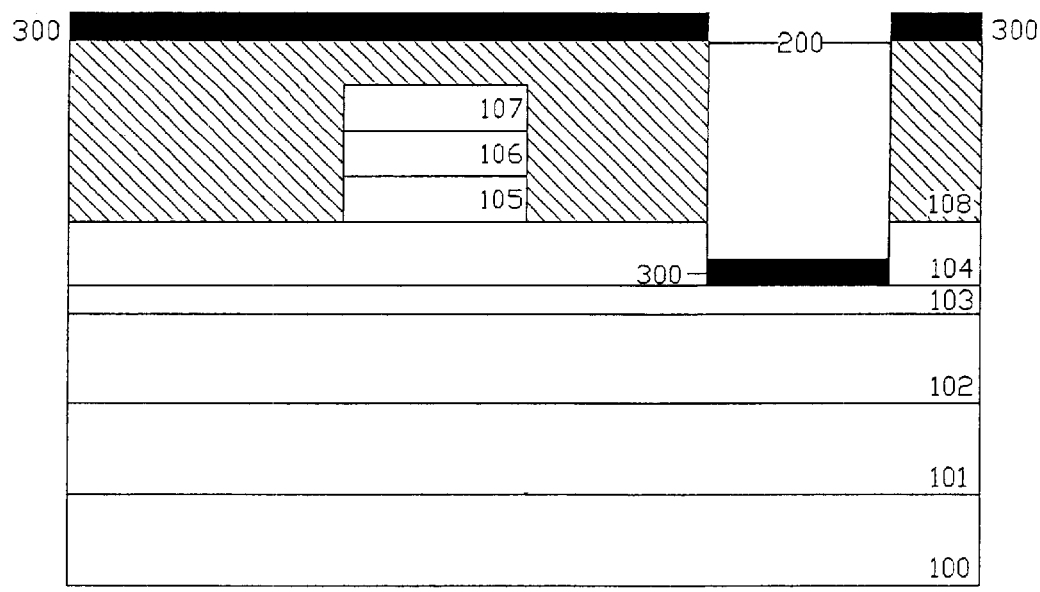

In FIG. 3, a reactive layer 300 comprising the first component of the desired metallization system for the ohmic contact to the base layer is deposited by standard techniques onto device 10 and adheres to surfaces of photoresist 108 and to the exposed portion of base layer 103. Use of platinum, palladium, nickel, ruthenium, and/or cobalt metals for this application is well known in the art. In prior art processes, the thickness of reactive layer 300 may range from about 50 angstroms to about 300 angstroms.

Figure 4:
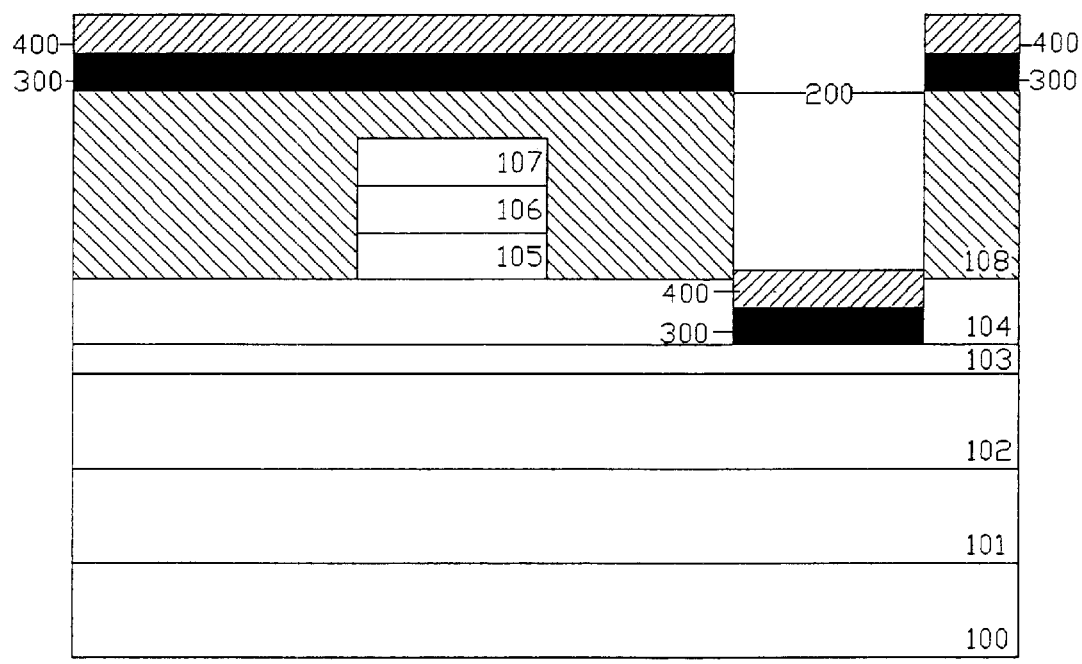

In FIG. 4, a diffusion barrier layer 400 comprising the second component of the desired base contact metallization system is deposited by standard techniques on reactive layer 300. Various base contact metallizations have been identified in the prior art, including Cr/Au, Ti/Pt, Ti/Au, Ru/Au, Pd/Au, Pt/W/Ag, Ni/In/W, W, Pt/Ti/Pt, Ni/Ti/Pt/Ti/Pt, Ti/ZrB$_2$/Au, and Ni/Pt/Au. Thus, depending upon the choice of reactive layer metallization, diffusion barrier layer 400 could comprise, for instance, tungsten, molybdenum, titanium, metal nitrides, metal silicides, and/or metal borides. If the base contact metallization system is a two-component system, such as Cr/Au, Ti/Au, or Pd/Au, diffusion barrier layer 400 may be omitted. In the prior art process chosen for illustration herein, the base contact metallization system is Pt/Ti/Pt/Au, and thus diffusion barrier layer 400 comprises titanium. In the prior art, the thickness of diffusion barrier layer 400 may range from about 100 angstroms to about 400 angstroms.

Figure 5:
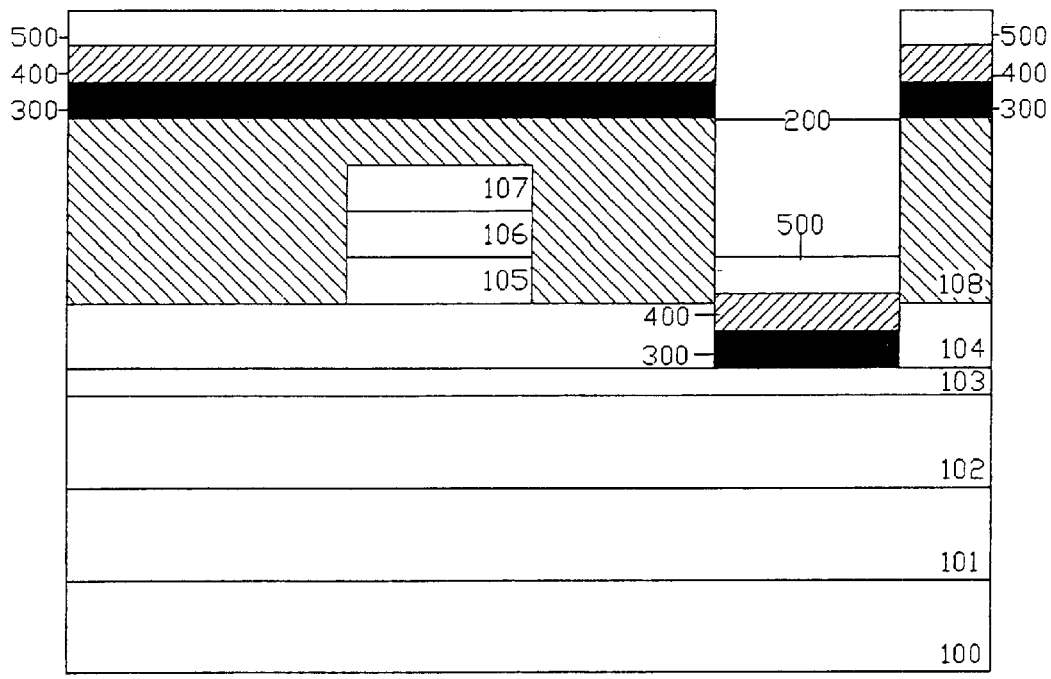

In FIG. 5, a low sheet resistance overlayer 500 comprising the third component of the desired base contact metallization system is deposited by standard techniques on diffusion barrier layer 400. In the prior art process chosen for illustration herein, the base contact metallization system is Pt/Ti/Pt/Au, and thus low sheet resistance overlayer 500 comprises gold. Alternatively, this low sheet resistance overlayer may comprise any one or more of a variety of different metals and/or materials having gold-like properties in the described application. For ease of discussion, gold will be used to represent all metals and/or materials having such gold-like properties. In the prior art, the sheet resistance of low sheet resistance overlayer 500 may range from about 0.1 ohms per square to about 1.0 ohms per square. If the base contact metallization system is a two-component system, such as Cr/Au, Ti/Au, or Pd/Au, low sheet resistance overlayer 500 may be deposited directly on reactive layer 300.

Figure 6:
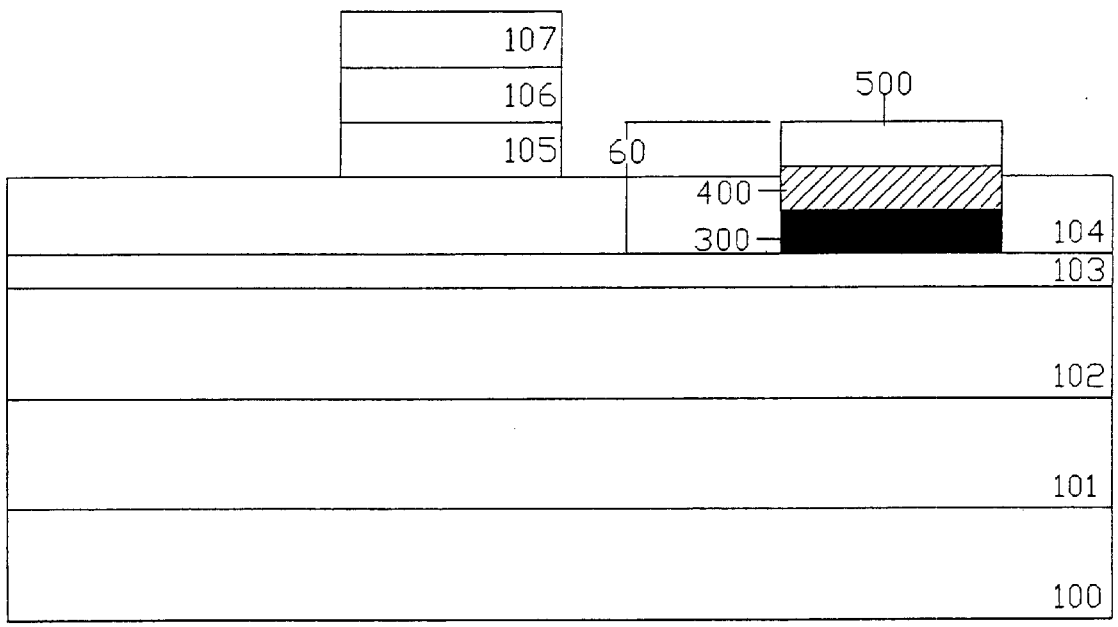

After deposition of low sheet resistance overlayer 500, photoresist 108 is removed, for example, by a solvation process, thereby lifting off the excess metallization deposited thereon and leaving base contact system 60 (FIG. 6) as deposited on base layer 103. FIG. 6 illustrates the structure of an exemplary base contact system of the prior art comprising a platinum reactive layer 300, a titanium barrier layer 400, and a low sheet resistance overlayer 500.

A high-temperature alloy step follows the process illustrated in FIGS. 1–6 and occurs after deposition of the collector contact, the process for which is not herein described, but which is well known to those skilled in the art. The high-temperature alloy step is typically employed to drive the desired collector contact metallization/GaAs semiconductor interfacial reaction.

Figure 7:
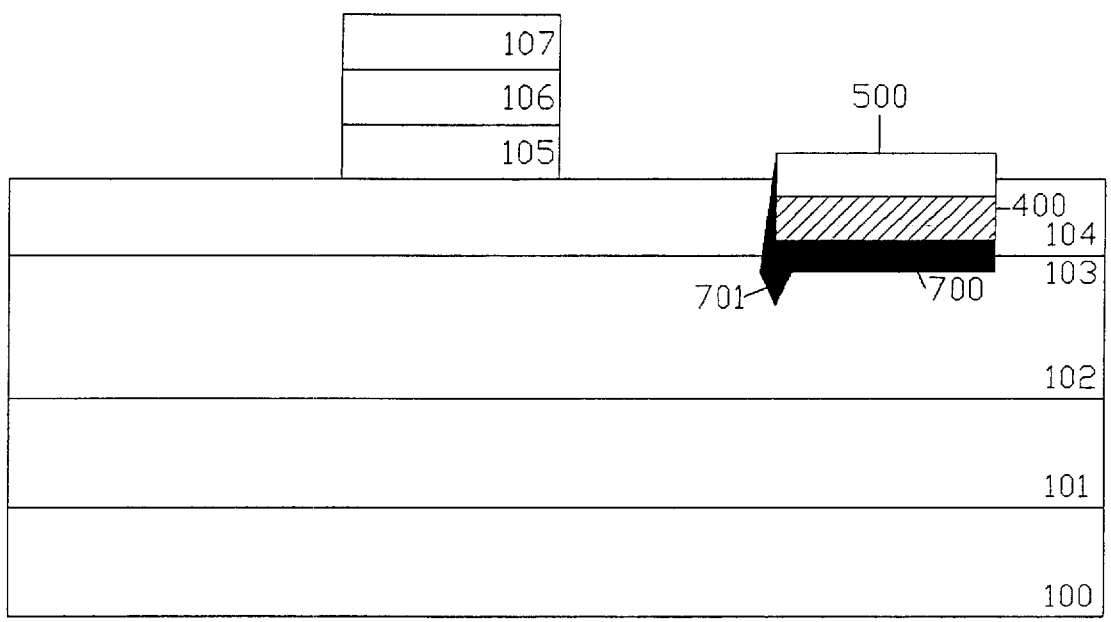
FIG. 7 illustrates, in cross-section, a typical alloy "spike" formed in the interfacial layer between the ohmic contact and the base layer during HBT fabrication in accordance with the prior art processes.

FIG. 7 illustrates a typical alloy spike formed in the interfacial layer between the base contact and the base layer during fabrication in accordance with prior art processes. During a high-temperature alloy process, the reactive layer diffuses into and reacts with the GaAs base layer, forming an interfacial layer 700 comprising the reaction products. For example, if the reactive layer comprises platinum, interfacial layer 700 will comprise platinum arsenide, as well as any unreacted platinum and various reaction by-products. An alloy spike 701 may be inadvertently formed when material from low sheet resistance overlayer 500 and/or other metallizations layers migrates downward and "spills over" the edge of diffusion barrier layer 400, then reacts with and/or diffuses into base layer 103. Because base layer 103 in an HBT is preferably ultra-thin, uncontrolled reaction of base contact metals with the GaAs base layer may result in alloy spike 701 extending through base layer 103 and into collector layer 102, a phenomenon herein described as "punchthrough."

The present invention solves the problem of base contact punchthrough by reducing or eliminating the uncontrolled reaction of base contact metals with the base layer. In a preferred embodiment, all or substantially all excess sources of reactive metal—such as platinum and gold—that may cause "spillover" at the contact edge are eliminated. Referring now to FIGS. 8–12, an exemplary embodiment of the present invention suitably comprises the following process.

Figure 8:
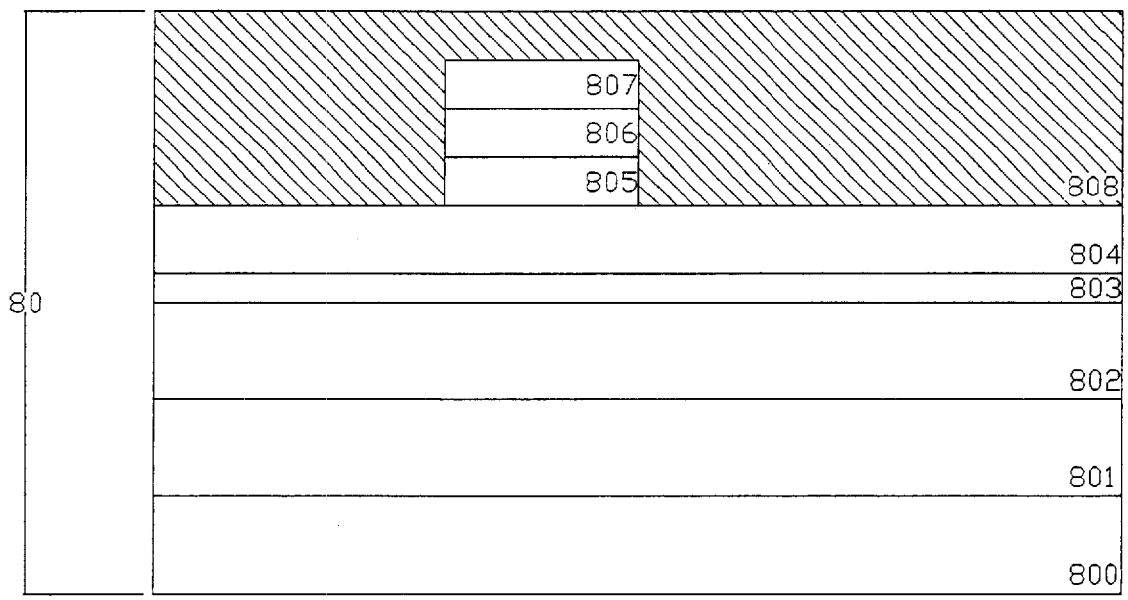

In FIG. 8, an N+ InGaAs layer 806, an N+ GaAs cap contact layer 805, an N type InGaP or AlGaAs emitter layer 804, a P+ GaAs base layer 803, an N− GaAs collector layer 802, and an N+ GaAs subcollector layer 801 are formed on a semi-insulating GaAs substrate 800. In addition, an emitter contact 807 is deposited on N+ InGaAs layer 806 using techniques well-known to those skilled in the art. A photoresist masking material 808 is deposited on emitter layer 804 and patterned using standard photolithographic techniques. Emitter layer 804 is then etched, for example, by plasma or reactive ion etching techniques known in the art using photoresist 808 as a mask to provide an etched region 90 as shown in FIG. 9. Etched region 90 extends through emitter layer 804 to the exposed surface of base layer 803.

FIG. 10, a reactive layer 110 comprising the first component of the desired metallization system for the ohmic contact to the base layer is deposited by standard techniques onto device 80 and adheres to surfaces of photoresist 808 and to the exposed portion of base layer 803. Reactive layer 110 may be formed of any material that forms a low barrier height contact to P+ doped GaAs. For example, the use of platinum, palladium, nickel, ruthenium, gold and cobalt in this application is well known in the art. In one embodiment of the present invention, reactive layer 110 metallization may be platinum, palladium, nickel, ruthenium, gold, cobalt or any similar metal that reacts with gallium arsenide to form a suitable interfacial layer. Preferably, reactive layer 110 metallization comprises platinum. Although depicted in FIG. 10 as being perfectly aligned with the adjacent areas of the semiconductor device, those skilled in the art will understand that reactive layer 110—as well as prior and subsequently-deposited layers—may be larger or smaller than the etched area and/or may be displaced within the etched area.

In accordance with a preferred embodiment of the present invention, the thickness of reactive layer 110 is minimized such that the amount of material deposited to form the reactive layer is sufficient to create low contact resistance at the interface of reactive layer 110 and base layer 803. In accordance with one embodiment of the present invention, the amount of platinum deposited on base layer 803 to form the base contact is optimized such that the deposited platinum reacts with the GaAs base layer and the resultant platinum arsenide (PtAs) interfacial layer reaches equilibrium during manufacture. If equilibrium is reached, no further reaction between the platinum metal and the GaAs occurs and "punchthrough" caused by reactive diffusion is minimized. In one embodiment of the present invention, reactive layer 110 has a thickness of between about 10 and about 500 angstroms. In a preferred embodiment of the present invention, reactive layer 110 has a thickness of between about 20 and about 100 angstroms. Preferably, reactive layer 110 has a thickness of about 40 angstroms.

Figure 11:
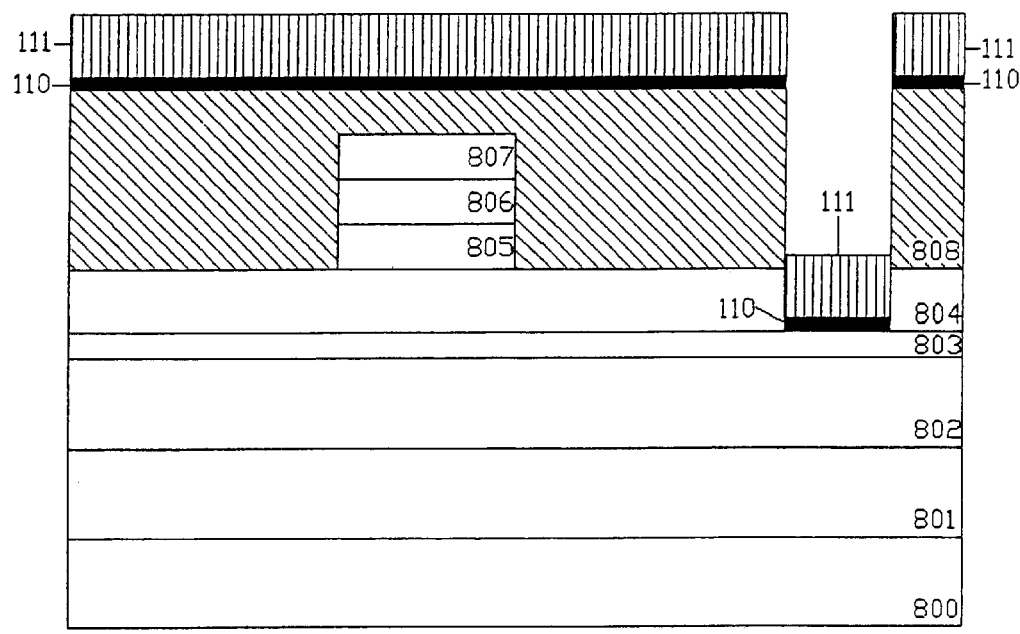

In FIG. 11, a refractory layer 111 comprising the second component of the desired base contact metallization system is deposited by standard techniques on reactive layer 110. Refractory layer 111 may be formed of any suitable material exhibiting low reactivity and high conductivity, such that refractory layer 111 becomes an effective current spreading layer on the device and reduces base contact sheet resistance. For example, refractory layer 111 may be formed from Ti, Ta, Mo, W, TiW, TaN, metal nitrides, metal silicides, metal borides, etc.

In accordance with a preferred embodiment of the present invention, refractory layer 111 has a thickness of at least about 100 angstroms. Preferably, refractory layer 111 has a thickness of about 800 angstroms. In a preferred embodiment, the increased thickness of the refractory layer metallization improves base contact sheet resistance and eliminates the need for deposition of a low-resistivity, high-conductivity gold overlayer.

Reactive layer 110 and refractory layer 111 may be deposited using any of a variety of deposition techniques well known in the art, including evaporation, reactive or nonreactive sputtering, chemical vapor deposition, electroplating, electroless plating, or any combination of these techniques. For example, the reactive layer could be deposited by electroplating and the refractory layer could be subsequently deposited by sputtering.

Figure 12:
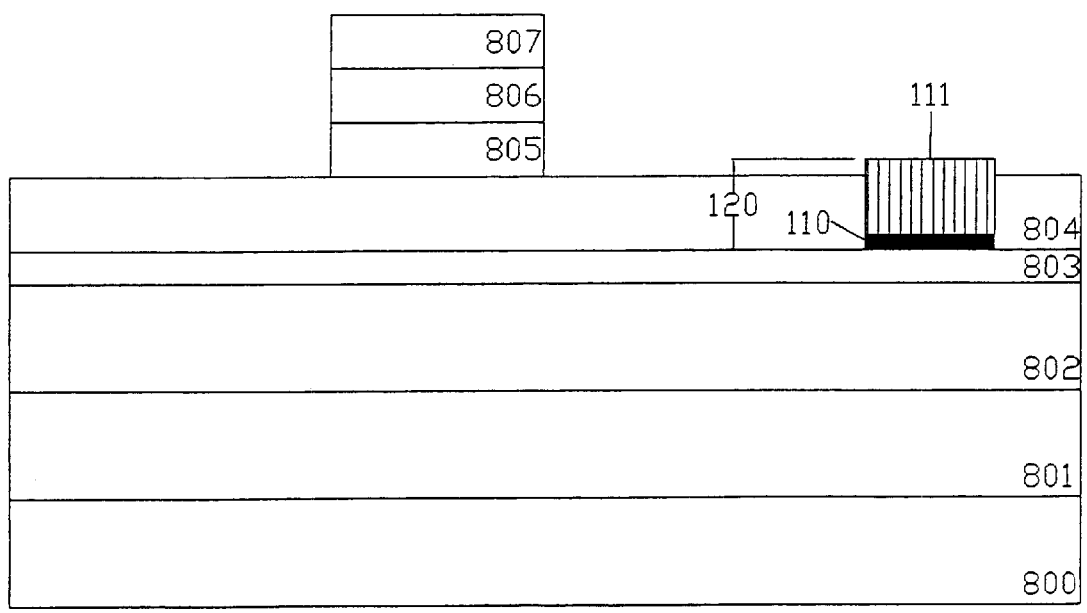

After deposition of refractory layer 111, photoresist 808 is removed, thereby lifting off the excess metallization deposited thereon and leaving base contact system 120 (FIG. 12) as deposited on base layer 803. Removal of photoresist 808 may be accomplished by a variety of techniques known to those skilled in the art, including, for example, solvation, liftoff patterning, and etching. FIG. 12 illustrates the structure of an exemplary base contact system of the present invention comprising a platinum reactive layer 110 and a titanium refractory layer 111. No overlayer metallization comprising gold or other gold-like material, except in trace amounts, is needed.

Figure 13:
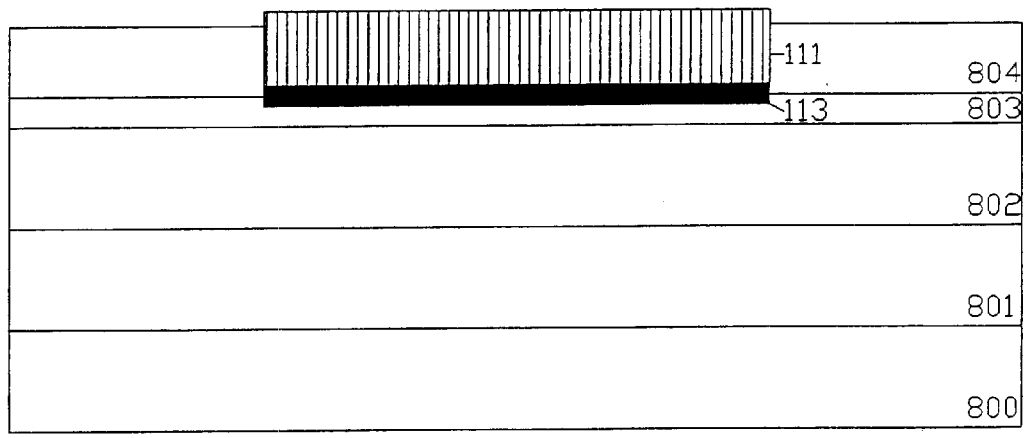
FIG. 13 illustrates, in cross-section, an ohmic contact on the base layer of an HBT formed in accordance with one embodiment of the present invention.

A high-temperature treatment step follows the formation of the ohmic contact to the collector layer and causes the desired reaction between reactive layer 110 and GaAs base layer 803. FIG. 13 illustrates, in cross-section, an ohmic contact on the base layer of an HBT formed in accordance with one embodiment of the present invention. Interfacial layer 113 comprises the reaction product of the high-temperature treatment step, in this case, platinum arsenide (PtAs). In accordance with one embodiment of the present invention, the thickness of reactive layer 110 deposited on base layer 803 to form the base contact is optimized such that all deposited platinum reacts with the GaAs base layer and the resultant platinum arsenide (PtAs) interfacial layer reaches equilibrium during manufacture. Because equilibrium is reached and the potential for further chemical reaction between the platinum reactive layer and the GaAs base layer has been eliminated, no further reaction between the platinum metal and the GaAs occurs and "punch-through" caused by reactive diffusion is minimized. Further, because no overlayer metallization exists on refractory layer 111, no uncontrolled "spillover" reaction at the base contact/base layer interface occurs. Thus, interfacial layer 113 is preferably uniform in thickness and generally homogeneous, and no portion of interfacial layer 113 extends through base layer 803 into collector layer 802.

By now it should be appreciated that there has been provided a method of forming contacts on thin base layer HBTs that eliminates base contact punchthrough of reactive contact metallization, reduces raw material costs by eliminating and/or minimizing the use of precious metals, such as gold and platinum, and facilitates manufacturing by reducing the number of metallization layers in the contact structure, without sacrificing performance or functionality of the device. In particular, there has been provided herein a suitable ohmic contact for thin base layer FIBTs that exhibits low sheet resistance, but that excludes reactive metal overlayers, which have proven detrimental to the reliability and manufacturability of HBT devices of the prior art.

While the present invention has been described with reference to specific preferred embodiments thereof, it will be understood by those skilled in the art that various changes may be made without departing from the true spirit and scope of the invention. For example, processes similar to those described in the preferred embodiment, but differing by, for example, the sequence and/or number of process steps, may be utilized in the manufacture of devices in accordance with the present invention. Likewise, a variety of different materials may be utilized that are suitable for use in connection with the present invention. And as stated above, the present invention is not limited to the manufacture of HBTs, rather, specific embodiments of the present invention may be useful in the design and manufacture of a wide range of semiconductor devices, including, for example, P+ contacts to laser diodes, light emitting diodes (LEDs), Schottky diodes, field effect transistors (FETs), metal-semiconductor field effect transistors (MESFETs), metal-oxide-semiconductor field effect transistors (MOSFETs), high electron mobility transistors (HEMTs), and other compound semiconductor and optoelectronic devices. Of course, many modifications may be made to adapt the invention to other contexts and applications without departing from its essential teachings.

We claim:

1. An ohmic contact of a gallium arsenide semiconductor device comprising:
   (a) a reactive layer formed directly on a group III–V substrate; and
   (b) a refractory layer formed directly on the reactive layer, wherein said refractory layer is substantially free of gold and wherein the refractory layer has a thickness of at least about 100 angstroms that eliminates the need for deposition of a low-resistivity, high-conductivity overlayer,
   and wherein the ohmic contact is exclusive of a metal overlayer on the refractory layer.

2. An ohmic contact according to claim 1 wherein said reactive layer comprises platinum, palladium, indium, nickel, ruthenium, gold or cobalt.

3. An ohmic contact according to claim 1 wherein said refractory layer comprises a material selected from the group comprising titanium, molybdenum, tungsten, TiW, metal nitrides, metal silicides and metal borides.

4. An ohmic contact according to claim 1 wherein said reactive layer has a thickness in the range of about 10 to about 500 angstroms.

5. An ohmic contact according to claim 1 wherein said reactive layer has a thickness in the range of about 20 to about 100 angstroms.

6. An ohmic contact according to claim 1 wherein said reactive layer has a thickness of about 40 angstroms.

7. An ohmic contact according to claim 1 wherein said refractory layer thickness is about 800 angstroms.

8. An ohmic contact according to claim 1 wherein said reactive layer comprises platinum.

9. An ohmic contact according to claim 1 wherein said refractory layer comprises titanium.

10. An ohmic contact of a gallium arsenide semiconductor device comprising:
    (a) a reactive layer formed directly on a group III–V substrate, said reactive layer comprising platinum, palladium, nickel, ruthenium, or cobalt and having a thickness of from about 10 to about 500 angstroms; and
    (b) a refractory layer formed directly on the reactive layer, said refractory layer comprising a material selected from the group of: titanium, molybdenum, tungsten, TiW, metal nitrides, metal silicides and metal borides, and having a thickness of at least about 100 angstroms, wherein said refractory layer is substantially free of gold and wherein the refractory layer has a thickness that eliminates the need for deposition of a low-resistivity, high-conductivity overlayer,
    and wherein the ohmic contact is exclusive of a metal overlayer on the refractory layer.

* * * * *